United States Patent [19]

Farnworth et al.

[11] Patent Number: 5,559,444
[45] Date of Patent: Sep. 24, 1996

[54] METHOD AND APPARATUS FOR TESTING UNPACKAGED SEMICONDUCTOR DICE

[75] Inventors: Warren Farnworth, Nampa; Salman Akram; David Hembree, both of Boise, all of Id.

[73] Assignee: Micron Technology, Inc., Boise, Id.

[21] Appl. No.: 452,990

[22] Filed: May 30, 1995

Related U.S. Application Data

[63] Continuation-in-part of Ser. No. 387,687, Feb. 13, 1995, which is a continuation-in-part of Ser. No. 137,675, Oct. 14, 1993, abandoned, which is a continuation-in-part of Ser. No. 709,858, Jun. 4, 1991, abandoned, and a continuation-in-part of Ser. No. 788,065, Nov. 5, 1991, Pat. No. 5,440,240, and a continuation-in-part of Ser. No. 981,956, Nov. 24, 1992.

[51] Int. Cl.$^6$ .................................................. G01R 1/02
[52] U.S. Cl. ........................ 324/754; 324/755; 324/765; 29/846
[58] Field of Search .................................. 324/754, 755, 324/765, 72.5, 73.1, 158.1; 439/45, 482, 66, 70; 437/8; 29/846, 852

[56] References Cited

U.S. PATENT DOCUMENTS

| | | | |
|---|---|---|---|
| 4,585,991 | 4/1986 | Reid et al. | 324/158 P |
| 4,899,107 | 2/1990 | Corbett et al. | 324/158 F |
| 4,937,653 | 6/1990 | Blonder et al. | 357/68 |
| 4,952,272 | 8/1990 | Okino et al. | 156/630 |
| 5,072,289 | 12/1990 | Sugimoto et al. | 357/68 |
| 5,073,117 | 12/1991 | Malhi et al. | 439/71 |
| 5,088,190 | 2/1992 | Malhi et al. | 29/843 |
| 5,090,118 | 2/1992 | Kwon et al. | 29/843 |
| 5,123,850 | 6/1992 | Elder et al. | 439/67 |
| 5,172,050 | 12/1992 | Swapp | 324/762 |
| 5,177,439 | 1/1993 | Liu et al. | 324/158 P |
| 5,225,037 | 7/1993 | Elder et al. | 156/644 |
| 5,302,891 | 4/1994 | Wood et al. | 324/158 F |
| 5,326,428 | 7/1994 | Farnworth et al. | 156/654 |
| 5,367,253 | 11/1994 | Wood et al. | 324/158.1 |

FOREIGN PATENT DOCUMENTS 1-205301  8/1989  Japan .

OTHER PUBLICATIONS

Miyake, Koyoshi et al., "Connectivity Analysis of New 'Known Good Die' Connection System Using Microbumps", Nitto Denko Corporation, Japan, Technical Paper, Mar. 22, 1993.

Yashhijo, Yamamoto, et al., "Evaluation of New Microconnection System Using Microbumps", ISHM '93 Proceedings, Japan, pp. 370–378; (1993).

Cloud et al., "Equipment, Processes and Methods For High Volume KGD Production", Semicon West 1994, Mountview, CA., Third Annual Manufacturing, Jul. 2, 1994, text pp. 150, 170.

Primary Examiner—Vinh P. Nguyen
Attorney, Agent, or Firm—Stephen A. Gratton

[57] ABSTRACT

A method and apparatus for testing unpackaged semiconductor dice is provided. The method includes forming an interconnect-alignment fixture for use in a test apparatus adapted to hold and apply test signals to the die during burn-in and full functionality testing. The interconnect-alignment fixture includes an interconnect plate formed out of a material such as silicon. The interconnect plate includes raised contact members covered with a conductive layer and adapted to penetrate contact locations on the die to a limited penetration depth. The interconnect-alignment fixture also includes an alignment plate formed with etched alignment openings for aligning contact locations on the die with the contact members on the interconnect plate during the test procedure. In addition, the alignment plate includes access openings for establishing an electrical connection to the contact members on the interconnect plate using wire bonding or mechanical electrical connectors. The interconnect plate and alignment plate are fabricated at the wafer level and then singulated using semiconductor circuit fabrication techniques.

30 Claims, 4 Drawing Sheets

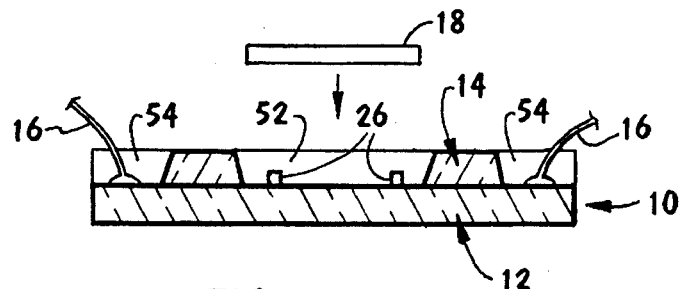
FIG. 1A
FIG. 1B
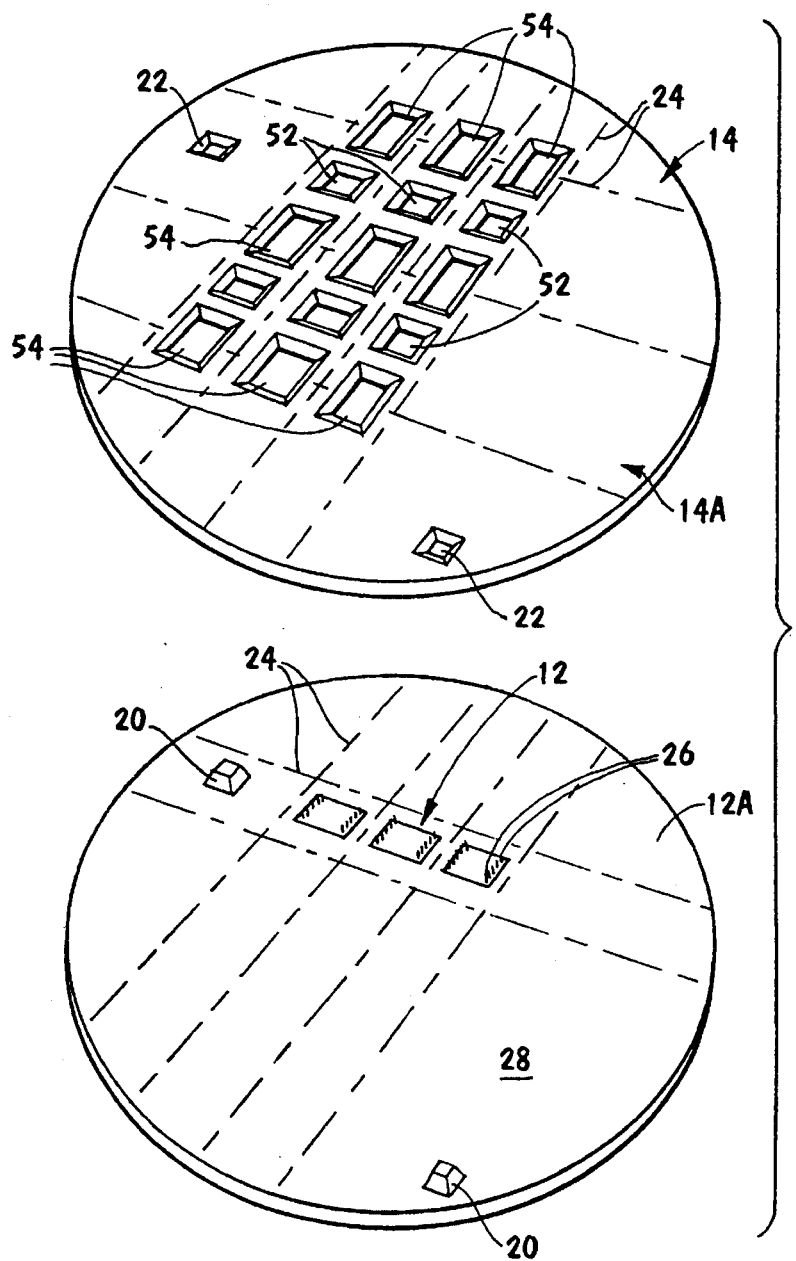

METHOD AND APPARATUS FOR TESTING UNPACKAGED SEMICONDUCTOR DICE

CROSS REFERENCE TO RELATED APPLICATIONS

This application is a continuation-in-part of copending U.S. patent application, Ser. No. 08/387,687 filed on Feb. 13, 1995 (pending) which is a continuation-in-part of: application Ser. No. 08/137,675 filed on Oct. 14, 1993 (now abandoned), which is a continuation-in-part of application Ser. No. 07/709,858, filed on Jun. 4, 1991, abandoned; and a continuation-in-part of application Ser. No. 07/788,065, filed Nov. 5, 1991 (now U.S. Pat. No. 5,440,240); and a continuation-in-part of application Ser. No. 07/981,956 (pending) filed Nov. 24, 1992.

This application is related to copending U.S. application Ser. Nos. 08/335,267 filed Nov. 7, 1994 (now U.S. Pat. No. 5,483,741); 08/206,747 filed Mar. 4, 1994 (now U.S. Pat. No. 5,523,697); 08/073,005 filed Jun. 7, 1993 (now U.S. Pat. No. 5,408,190); 08/124,899 filed Sep. 21, 1993 (now U.S. Pat. No. 5,495,179); 08/046,675 filed Apr. 14, 1993 (now U.S. Pat. No. 5,367,253); 08/073,003 filed Jun. 7, 1993 (now abandoned); 08/120,628 filed Sep. 13, 1993 (now abandoned); 08/192,023 filed Feb. 3, 1994; 07/896,297 filed Jun. 10, 1992 (now U.S. Pat. No. 5,424,652); 08/192,391 filed Feb. 3, 1994 (now U.S. Pat. No. 5,483,176); and, 08/137,675 filed Oct. 14, 1993 (now abandoned); all of which are incorporated by reference.

FIELD OF THE INVENTION

This invention relates generally to semiconductor manufacture and more particularly to an improved method and apparatus for testing unpackaged dice.

BACKGROUND OF THE INVENTION

Microelectronics packages called hybrids, or multi chip modules, utilize unpackaged semiconductor die. Because of an increased use of hybrids, semiconductor manufacturers are required to supply unpackaged die that have been tested and certified as known good die (KGD). A known good die (KGD) is an unpackaged die having the same reliability as the equivalent packaged die.

The need for known good die has led to the development of test apparatus suitable for testing unpackaged semiconductor dice. As an example, test apparatus for conducting burn-in tests for unpackaged dice are disclosed in U.S. Pat. No. 4,899,107 to Corbett et al. and U.S. Pat. No. 5,302,891 to Wood et al., which are assigned to Micron Technology, Inc.

With this type of test apparatus, a non-permanent electrical connection must be made between contact locations on the die, such as bond pads, and external test circuitry associated with the test apparatus. The bond pads provide a connection point for testing the integrated circuitry formed on the die. The test apparatus typically includes some type of interconnect for effecting the temporary electrical connection to the bond pads on the die.

In making this temporary electrical connection, it is desirable to effect a connection that causes as little damage as possible to the bond pad. If the temporary connection to a bond pad damages the pad, the entire die may be rendered as unusable. This is difficult to accomplish because the connection must also produce a low resistance or ohmic contact with the bond pad.

Another important consideration in testing of known good die is the alignment of the contact locations on the die with the corresponding contact structure on the test apparatus. In assembling the die with the test apparatus, it is desirable to quickly and efficiently align the contact locations on the die with the corresponding contact structures on the test apparatus.

OBJECTS OF THE INVENTION

In view of the foregoing, it is an object of the present invention to provide an improved method and apparatus for testing unpackaged semiconductor dice.

It is yet another object of the present invention to provide an improved method and apparatus for testing unpackaged semiconductor dice that is efficient, low cost and compatible with high volume semiconductor manufacture.

It is a further object of the present invention to provide an improved apparatus for testing unpackaged semiconductor dice in the form of an interconnect alignment fixture.

It is a further object of the present invention to provide an improved interconnect-alignment fixture characterized by an improved alignment structure for mechanically aligning contact locations on unpackaged dice with corresponding contact members on the interconnect.

Other objects, advantages and capabilities of the present invention will become more apparent as the description proceeds.

SUMMARY OF THE INVENTION

In accordance with the present invention, an improved method and apparatus for testing unpackaged semiconductor dice are provided. The method includes forming an interconnect-alignment fixture for an unpackaged die, and then using the interconnect-alignment fixture in a test apparatus for establishing a temporary electrical connection with the die for testing.

The interconnect-alignment fixture is fabricated out of silicon or a similar material using semiconductor fabrication processes. The fixture includes an interconnect plate and an alignment plate aligned with one another and bonded together as an assembly for use in the test apparatus. The interconnect plate includes a silicon substrate having contact members formed as raised projections covered with a conductive material. The raised projections are formed in a pattern that matches a pattern of contact locations (e.g., bond pads) on a semiconductor die and are adapted to penetrate the contact locations on the die to a limited penetration depth. The conductive material is in electrical communication with conductive traces formed on the substrate to provide a conductive path to the raised projections for applying test signals to the die.

The alignment plate of the fixture includes etched alignment openings adapted to mechanically align the die with the interconnect plate. In addition, the alignment plate includes etched access openings for electrically connecting the conductive traces on the interconnect plate to the test fixture. The electrical connection to the conductive traces can be made by wire bonding or using a mechanical electrical connector such as a clip or slide connector.

Preferably the interconnect plate and the alignment plate of the fixture are initially formed as separate wafers using masking, etching and deposition processes employed in semiconductor fabrication. After being fabricated separately, the wafers are aligned, bonded together and then singulated to form a plurality of separate interconnect-alignment fixtures, each suitable for testing an unpackaged die. Alignment structures such as alignment pins or tabs are also formed on the interconnect and alignment wafers for aligning these components during assembly. The alignment-interconnect fixtures can be used with a test apparatus such as disclosed in the above cited U.S. Pat. No. 5,302,891 to Wood et al. This type of test apparatus is suitable for applying test signals to the die during burn-in and full functionality testing.

BRIEF DESCRIPTION OF THE DRAWINGS

FIG. 1A is a schematic side elevation view of an interconnect-alignment fixture constructed in accordance with the invention;

FIG. 1B is an exploded perspective view of an interconnect wafer and an alignment wafer prior to singulation to form a plurality of separate fixtures such as shown in FIG. 1;

DETAILED DESCRIPTION OF THE PREFERRED EMBODIMENTS

Figure 2:
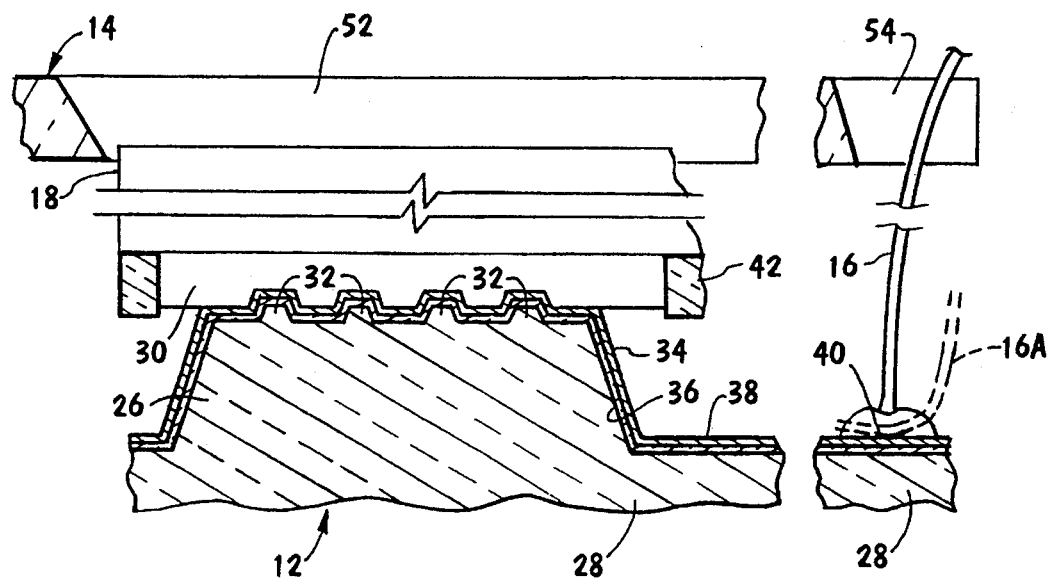
FIG. 2 is an enlarged schematic view partially in cross-section of the interconnect-alignment fixture showing a contact member of the interconnect plate in contact with a bond pad of a semiconductor die.

Referring now to FIG. 1A, an interconnect-alignment fixture 10 constructed in accordance with the invention is shown. The fixture 10 includes an interconnect plate 12 and an alignment plate 14. The fixture 10 is adapted for use with a test apparatus (not shown) such as disclosed in the above cited U.S. Pat. No. 5,302,891 and in copending, commonly assigned, U.S. patent application Ser. Nos. 08/345,064 and 08/398,309 each entitled "Carrier For Testing An Unpackaged Semiconductor Die", all of which are incorporated herein by reference.

The fixture 10 is placed within such a test apparatus for testing a semiconductor die 18. A conductive path is established between the interconnect plate 12 and the test apparatus using wires 16 that are wire bonded to the interconnect plate 12 and to corresponding connection points on the test apparatus. In place of wire bonding, a mechanical electrical connector such as a slide connector 16A (FIG. 2) can be used in place of wires 16.

As shown in FIG. 1A, the alignment plate 14 of the fixture 10 is adapted to align the die 18 with the interconnect plate 12. The interconnect plate 12 of the fixture 10 is adapted to establish a temporary electrical connection between the die 18 and the test apparatus for testing (e.g., full functionality testing, burn-in testing).

As shown in FIG. 1B, a plurality of interconnect plates 12 and alignment plates 14 are formed at the wafer level in a manner similar to the formation of dice on a semiconductor wafer using semiconductor fabrication techniques. An interconnect wafer 12A contains the interconnect plates 12 and an alignment wafer 14A contains the alignment plates 14. The wafers 12A and 14A are fabricated separately, aligned and then bonded together. Following assembly, the wafers 12A and 14A are saw cut along saw cut lines 24 to form the individual interconnect plates 12 and alignment plates 14.

An alignment structure is provided for aligning the interconnect wafer 12A and the alignment wafer 14A during assembly. The alignment structure includes alignment pins 20 formed on the interconnect wafer 12A and alignment pin openings 22 formed in the alignment wafer 14A. The alignment pins 20 and alignment pin openings 22 are adapted for mating engagement.

Following assembly, and prior to singulation of the individual fixtures 10, the wafers 12A and 14A are bonded together. One method of bonding the wafers together is with an adhesive such as an epoxy, acrylic, silicone or polyimide layer. Another method of bonding the wafers together is to form an insulating material, such as an oxide layer, over the exposed portions of the assembled wafers 12A and 14A. For wafers 12A and 14A formed of silicon, this can be accomplished using a low temperature plasma enhanced chemical vapor deposition process (PECVD). The plasma enhanced deposition process can include $O_2$ and a silicon containing species such as silane (silicon tetrahydride-$SiH_4$) or TEOS (tetraethylorthosilicate). During the PECVD deposition process an oxide layer forms on all of the exposed silicon surfaces and a mechanical bond is formed between the wafers 12A and 14A. In addition, the oxide helps to further insulate exposed surfaces of the assembly. The oxide can be on the order of 5 μm to 10 μm in thickness.

As shown in FIG. 1B, the interconnect wafer 12A includes a plurality of raised contact members 26 formed on a substrate 28. The contact members 26 match the size and spacing of bond pads 30 on the die 18. The substrate 28 is preferably formed of a silicon but can also be formed of other materials having a coefficient of thermal expansion (CTE) that closely matches the CTE of a silicon die. Suitable materials for the substrate 28 include monocrystalline silicon, silicon-on-glass, silicon-on-sapphire and ceramic.

As shown in FIG. 2, the contact members 26 are generally pyramidal in shape and include sloped sidewalls. The contact members 26 can be formed integrally with the substrate 28 using a wet or dry, isotropic or anisotropic, etch process. During such an etch process, a mask layer (e.g., silicon nitride) is formed on the substrate 28 and then patterned with openings and solid areas to form masking blocks (not shown). The contact members 26 are formed as the substrate 28 under the masking blocks is undercut by the etchant reacting with the substrate 28. The alignment pins 20 can be formed at the same time as the contact members 26 using the same etch process.

Alternately, in place of an isotropic or anisotropic etch process, the contact members 26 can be formed using an oxidizing process. With an oxidizing process the substrate 28 can be subjected to an oxidizing atmosphere to oxidize portions of the substrate 28 not covered by the masking blocks. When the oxide layer is stripped the resultant structure includes raised contact members 26.

Figure 3:
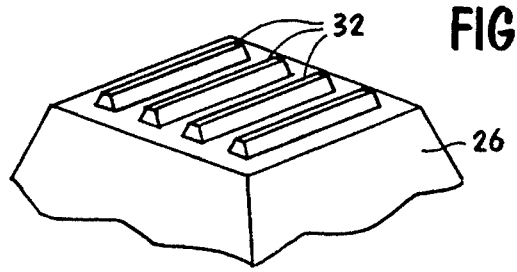
FIG. 3 is an enlarged perspective view of a contact member formed on an interconnect plate of the fixture.

Various methods for forming the substrate 28 with raised contact members 26 are disclosed in copending, commonly assigned U.S. patent application Ser. No. 08/387,687 which is incorporated herein by reference. Depending on the application, the contact members 26 can be formed with a height of from 1 μm to 100 μm or more. In addition, as clearly shown in FIGS. 2 and 3, the contact members 26 include penetrating projections 32 for piercing the bond pads 30 on the die 18 to a limited penetration depth. The penetrating projections 32 are preferably formed by etching the substrate 28 prior to etching the contact members 26. Such a process is described in detail in the previously cited copending patent applications.

As also shown in FIG. 2, the contact members 26 include a conductive layer 34 electrically isolated from the substrate 28 by an insulating layer 36. The insulating layer 36 can be formed by oxidation of the substrate 28 or by depositing a suitable insulating or dielectric material on the substrate 28. By way of example, oxidation can be accomplished by exposing the substrate 28 to an oxidizing atmosphere in a reaction chamber to form a layer of silicon dioxide ($SiO_2$). Silicon dioxide can also be deposited using CVD. TEOS (tetraethylorthosilane) can also be injected into a reaction chamber to grow silicon dioxide ($SiO_2$) at a temperature of about 400° C. Another commonly used insulator suitable for forming the insulating layer 36 is $Si_3N_4$ which can be deposited by CVD. A representative thickness for the insulating layer 36 is from about 500 Å to 6000 Å.

The conductive layer 34 is preferably formed of a metal selected based upon properties including, but not limited to, electrical resistance, thermal conductivity, strength, and chemical stability. Exemplary metals for use as conductive layer 34 include highly conductive metals such as aluminum and copper. Other suitable metals include the refractory metals, such as titanium (Ti), tungsten (W), tantalum (Ta), platinum (Pt), and molybdenum (Mo). Other suitable metals include cobalt (Co), nickel (Ni), gold (Au) and iridium (Ir). A thickness for the conductive layer 34 is from about 500 Å to about 10 μm.

The conductive layer 34 can be formed using a metallization process including deposition (e.g., CVD), followed by photopatterning and etching. Conductive traces 38 in electrical communication with the conductive layer 34 covering each contact member 26 can also be formed at the same time, of the same metal, and using the same metallization process. Alternately, the conductive layer 34 and conductive traces 38 can be formed of different (or the same) metals using separate metallization processes (e.g., CVD deposition, photopatterning, etching).

Figure 4:
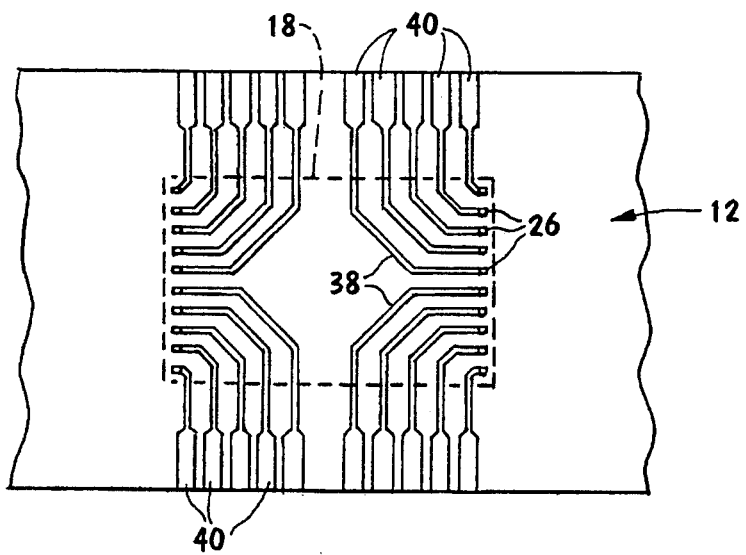
FIG. 4 is a partial plan view of the interconnect plate with the die superimposed thereon.

As clearly shown in FIG. 4, the conductive traces 38 are formed in a desired circuit pattern and include connection pads 40 for wire bonding the bond wires 16 (FIG. 2) or attaching the mechanical electrical connectors 16A. The bond wires 16, conductive traces 38 and conductive layer 34 establish an electrical path from external test circuitry to the bond pads 30 on the die 18 placed into contact with the contact members 26. Alternately in place of bond wires 16 the mechanical electrical connector 16A (FIG. 2) previously described can be used.

In the illustrative embodiment, the contact locations on the die 18 are bond pads 30 (FIG. 2) formed as flat metal pads (e.g., Al) embedded in a passivation layer 42. For establishing an electrical connection with the bond pads 30, the projections 32 of the contact member 26 penetrate into the bond pads 30 and pierce any native oxide present. However, the penetration depth of the projections 32 is limited by the stop plane provided by the top surface of the contact member 26. Optimally, the projections 32 penetrate about half way through the thickness of the bond pad 30. This limited penetration depth helps to prevent damage to the bond pads 30 of the die 18 during the test procedure.

Figure 5A:
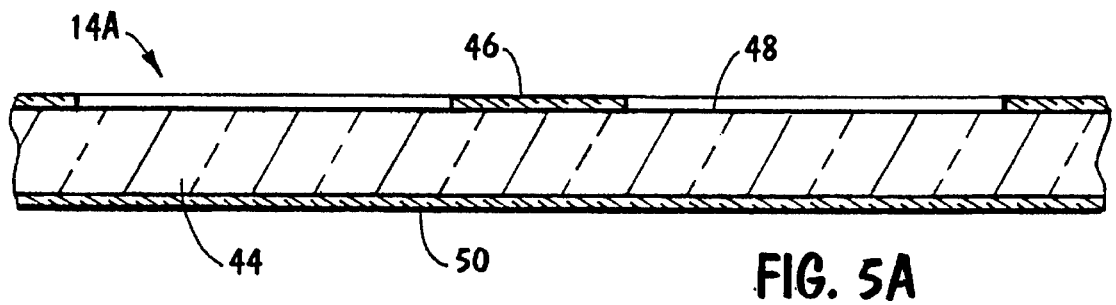
FIGS. 5A–5D are schematic cross sectional views illustrating steps in the formation of an alignment plate of the interconnect-alignment fixture.

Referring now to FIGS. 5A–5D, 6 and 7, process steps for forming the alignment wafer 14A are illustrated. As shown in FIG. 5A, the alignment wafer 14A includes a substrate 44 preferably formed of silicon or another material as described above. Initially a hard mask 46 is formed on the substrate 44. The hard mask 46 can be formed of a material, such as silicon nitride ($Si_3N_4$), that is initially deposited to a thickness of about 500 Å to 3000 Å using a suitable deposition process such as CVD. This material is then photopatterned and etched. The hard mask 46 includes openings 48 for etching the substrate 44. An etch stop layer 50 preferably of a same material as the hard mask 46 is also formed on the opposite surface substrate 44.

Figure 5B:
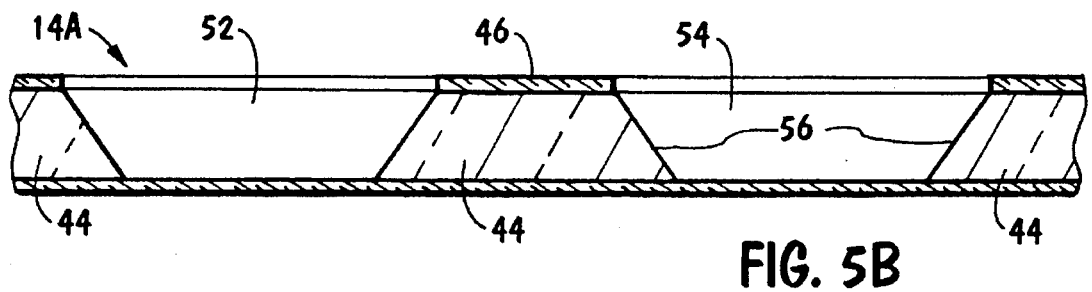

Next, as shown in FIG. 5B, the substrate 44 is etched to form a pattern of openings including alignment openings 52 and access openings 54. Typical etching techniques comprise wet anisotropic etching with a mixture of $KOH:H_2O$. This type of etching is also known in the art as bulk micro-machining. With an anisotropic etch the sidewalls 56 of the openings 52, 54 will be sloped at an angle of about 54° with the horizontal. The openings 52, 54 are etched through the full thickness of the substrate 44 using the etch stop layer 50 as an end point.

Figure 5C:
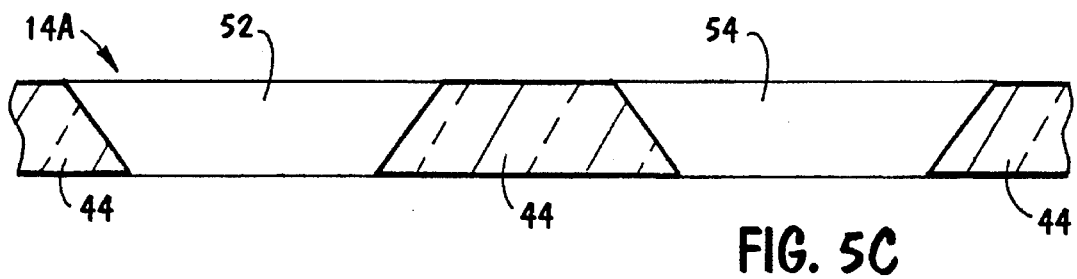

Next, as shown in FIG. 5C, the hard mask 46 and the etch stop layer 50 are removed. For a hard mask 46 and etch stop layer 50 formed of silicon nitride an etchant, such as $H_3PO_4$, that is selective to the substrate 44 can be used.

Figure 5D:
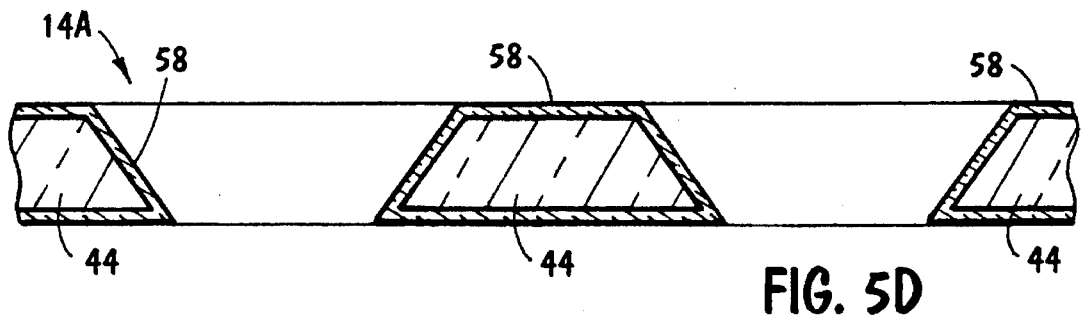

Next, as shown in FIG. 5D, an insulating layer 58 is formed on all exposed surfaces of the substrate 44. The insulating layer 58 can be an oxide such as $SiO_2$ formed by an oxidation process as previously described. The insulating layer 58 electrically insulates the alignment plate 14 (FIG. 1A) from other components in the assembled fixture 10.

Figure 6:
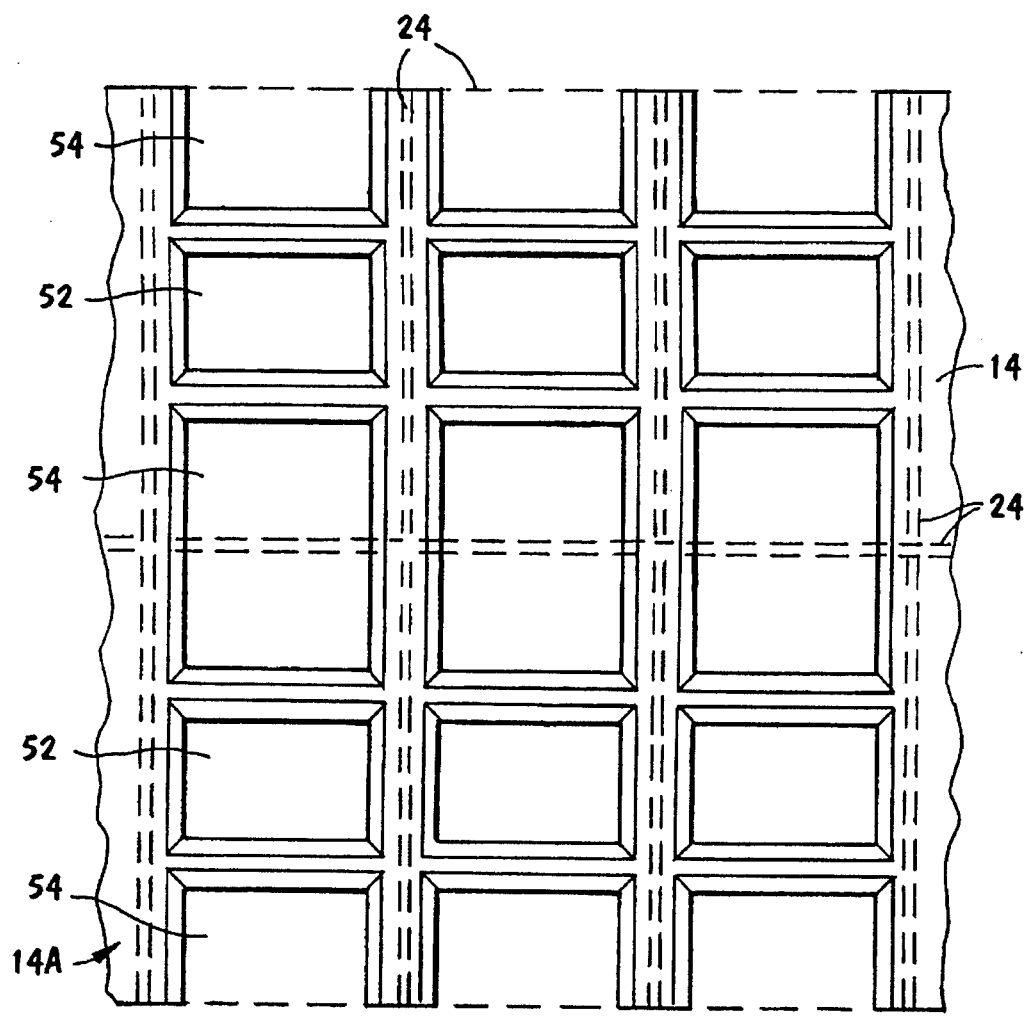
FIG. 6 is a plan view of the alignment plate of the interconnect-alignment fixture showing the alignment and access openings.
Figure 7:
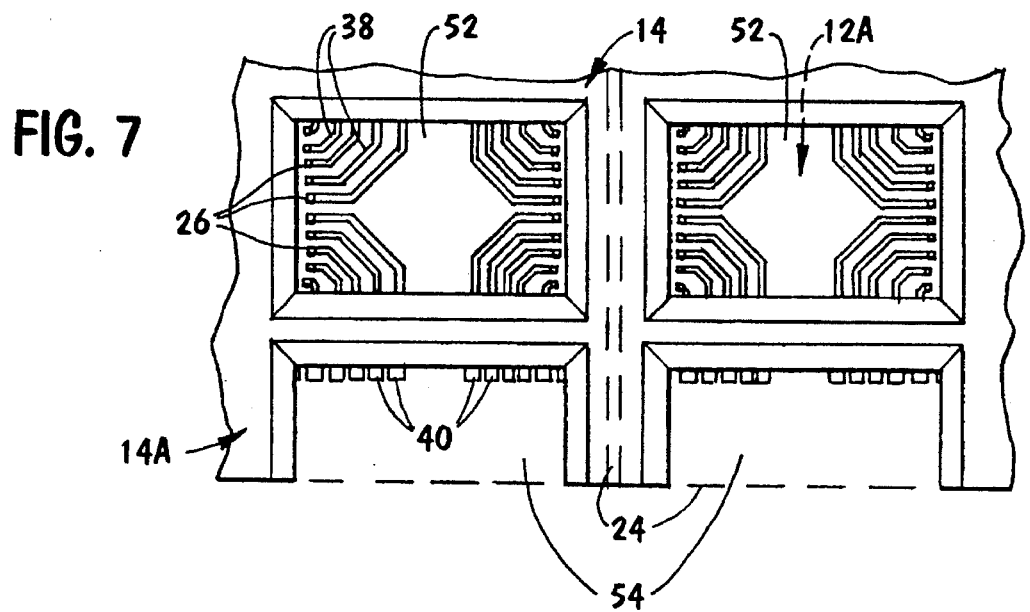
FIG. 7 is a plan view of the assembled interconnect-alignment fixture showing the alignment and access openings of the alignment plate superimposed on the interconnect plate.

As shown in FIG. 6, each alignment opening 52 includes an access opening 54 on either side. The saw cut lines 24 bisect the access openings 54 so that each saw cut ultimately forms two access openings 54. Each singulated fixture 10 includes an alignment opening 52 and a pair of access openings 54. As shown in FIG. 7, with the alignment wafer 14A aligned with and bonded to the interconnect wafer 12A, the access openings 54 allow access to the connection pads 40 of the conductive traces 38. This allows bond wires 16 (FIG. 2) or mechanical electrical connectors 16A to be attached to the conductive traces 38 as previously described, for establishing a conductive path from external test circuitry to the contact members 26.

Thus the invention provides an improved method and an improved apparatus for testing an unpackaged semiconductor die 18. An interconnect-alignment fixture 10 constructed in accordance with the invention can be used with a test apparatus to precisely align contact locations on the die 18 with contact members 26 on the interconnect plate 12. Furthermore, the contact members 26 are adapted to penetrate contact locations on the die 18 (e.g., bond pads 30) to a limited penetration depth to establish a low resistance connection while limiting damage to the contact locations. Advantageously, the interconnect-alignment fixture 10 can be formed with integrated circuit precision using semiconductor fabrication techniques such as masking, etching, deposition and oxidation.

Although preferred materials have been described, it is to be understood that other materials may also be utilized. Furthermore, although the method of the invention has been described with reference to certain preferred embodiments, as will be apparent to those skilled in the art, certain changes and modifications can be made without departing from the scope of the invention as defined by the following claims.

What is claimed is:

1. A method for testing an unpackaged semiconductor die, said method comprising:
   forming an interconnect wafer with a plurality of interconnect plates having raised contact members for establishing a temporary electrical connection with contact locations on the die;
   forming a conductive layer on each contact member;
   forming an alignment wafer with a plurality of alignment plates each having an alignment opening for the die;
   assembling the wafers together;
   singulating the wafers to form a test fixture including an interconnect plate and an alignment plate;
   placing the die in contact with a contact member on the interconnect plate using the alignment plate;
   establishing an electrical path between the conductive layer for the contact member on the interconnect plate and external test circuitry; and
   applying test signals to the die.

2. The method as claimed in claim 1 and further comprising forming the contact members by etching the interconnect wafer.

3. The method as claimed in claim 1 and further comprising forming the contact members with projections covered by the conductive layer and adapted to penetrate the contact locations on the die to a limited penetration depth.

4. The method as claimed in claim 1 and wherein the interconnect wafer and alignment wafer are formed of a material selected from the group consisting of silicon, silicon-on-sapphire, silicon-on-glass, germanium and ceramic.

5. The method as claimed in claim 1 and further comprising bonding the interconnect wafer and the alignment wafer together using an adhesive.

6. The method as claimed in claim 1 and further comprising bonding the interconnect wafer and the alignment wafer together by forming an oxide layer on the wafers.

7. A method for testing an unpackaged semiconductor die, said method comprising:
   forming an interconnect wafer with raised contact members, each of said contact members including a conductive layer in electrical communication with a conductive trace formed on the interconnect wafer;
   forming an alignment wafer having at least one alignment opening for aligning the die with the contact members and at least one access opening for establishing an electrical path to the conductive trace for each contact member;
   assembling the wafers with one another;
   singulating the assembled wafers into a plurality of test fixtures;
   aligning the die using the alignment opening on a test fixture and placing contact locations on the die in contact with the raised contact members on the test fixture;
   establishing the electrical path to the conductive trace for each contact member; and
   applying test signals to the die.

8. The method as claimed in claim 7 and further comprising forming the interconnect wafer using semiconductor fabrication techniques.

9. The method as claimed in claim 7 and further comprising forming the alignment wafer using semiconductor fabrication techniques.

10. The method as claimed in claim 7 and further comprising assembling the interconnect wafer and the alignment wafer using an alignment structure formed on the wafers.

11. The method as claimed in claim 10 and wherein the alignment structure includes an alignment pin formed on the interconnect wafer or the alignment wafer.

12. The method as claimed in claim 7 and further comprising forming the contact members with raised projections for penetrating the contact locations on the die to a limited penetration depth.

13. A fixture for testing an unpackaged semiconductor die, said fixture comprising:
   a substrate having raised contact members corresponding to contact locations on the die, each of said contact member including a projection for penetrating a contact location on the die to a limited penetration depth;
   a conductive layer formed on each raised contact member in electrical communication with a conductive trace formed on the substrate; and
   an alignment plate attached to the substrate said alignment plate including a first etched opening for aligning the die with the contact members and a second etched opening for establishing an electrical path to the conductive trace for each contact member.

14. The fixture as claimed in claim 13 and further comprising an alignment structure formed on the substrate for mating engagement With a mating alignment structure formed on the alignment plate.

15. The fixture as claimed in claim 13 and wherein the substrate is attached to the alignment plate using an adhesive.

16. The fixture as claimed in claim 13 and further comprising an oxide layer formed on the substrate and alignment plate after assembly for attaching the substrate to the alignment plate.

17. The fixture as claimed in claim 13 and wherein the substrate is fabricated using semiconductor fabrication techniques on a wafer.

18. The fixture as claimed in claim 13 and wherein the alignment plate is fabricated using semiconductor fabrication techniques on a wafer.

19. The fixture as claimed in claim 13 and further comprising a connection pad formed on each conductive trace for wire bonding a wire or for attaching a mechanical electrical connector.

20. The fixture as claimed in claim 13 and further comprising an etched alignment opening on the alignment plate for mating engagement with an etched pin on the substrate.

21. A fixture for testing an unpackaged semiconductor die, said fixture comprising:
   a substrate having raised contact members etched into the substrate, said contact members corresponding to contact locations on the die and including penetrating projections for penetrating the contact locations to a limited penetration depth;
   a conductive layer formed on each raised contact member in electrical communication with a conductive trace formed on the substrate;
   an alignment plate aligned and bonded to the substrate and including an etched opening for aligning the die with the contact members and an etched opening for establishing an electrical path to the conductive traces; and
   an alignment structure formed on the substrate and alignment plate for aligning the substrate with the alignment plate during assembly.

22. The fixture as claimed in claim 21 and wherein the substrate is bonded to the alignment plate with an adhesive.

23. The fixture as claimed in claim 21 and wherein the substrate is bonded to the alignment plate by forming an oxide on the substrate and alignment plate.

24. The fixture as claimed in claim 21 and further comprising a pad formed on each conductive trace for wire bonding a wire or attaching a mechanical electrical connector.

25. The fixture as claimed in claim 21 and wherein the alignment structure includes an alignment pin formed integrally with the substrate using an etch process.

26. A method for forming a test fixture for testing an unpackaged semiconductor die, said method comprising the steps of:

forming an interconnect wafer with a plurality of interconnect plates each having a pattern of raised contact members corresponding to contact locations on the die;

forming a conductive layer on each of the contact members;

forming a conductive trace on the interconnect wafer in electrical communication with each conductive layer;

forming an alignment wafer with a plurality Of alignment plates each having an alignment opening for aligning the die;

assembling the interconnect wafer and the alignment wafer together; and singulating the interconnect plates and the alignment plates from the assembled wafers.

27. The method as claimed in claim 26 and further comprising forming an access opening in each alignment plate for establishing an electrical path to the conductive traces.

28. The method as claimed in claim 26 and further comprising forming each raised contact member with a penetrating projection adapted to penetrate a corresponding contact location to a limited penetration depth.

29. The method as claimed in claim 28 and wherein the raised contact members and penetrating projections are formed by etching a silicon substrate.

30. The method as claimed in claim 26 and further comprising forming an alignment pin on the interconnect wafer and a corresponding opening in the alignment wafer for aligning the wafers prior to the singulating step.

* * * * *